United States Patent
Kajiwara et al.

(10) Patent No.: US 9,743,539 B2
(45) Date of Patent: Aug. 22, 2017

(54) IN-VEHICLE ELECTRONIC MODULE (71) Applicant: Hitachi Automotive Systems, Ltd., Hitachinaka-shi, Ibaraki (JP)

(72) Inventors: Ryouichi Kajiwara, Tokyo (JP); Masaru Kamoshida, Hitachinaka (JP); Toshiaki Ishii, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/100,852

(22) PCT Filed: Nov. 17, 2014

(86) PCT No.: PCT/JP2014/080290
§ 371 (c)(1),
(2) Date: Jun. 1, 2016

(87) PCT Pub. No.: WO2015/098352
PCT Pub. Date: Jul. 2, 2015

(65) Prior Publication Data
US 2016/0309600 A1    Oct. 20, 2016

(30) Foreign Application Priority Data
Dec. 27, 2013 (JP) .................................. 2013-270798

(51) Int. Cl.
*H05K 5/00* (2006.01)
*B23K 35/22* (2006.01)
(Continued)

(52) U.S. Cl.
CPC ......... *H05K 5/0069* (2013.01); *B23K 1/0016* (2013.01); *B23K 1/08* (2013.01);
(Continued)

(58) Field of Classification Search
USPC ........................................ 361/786, 785, 784
See application file for complete search history.

(56) References Cited

U.S. PATENT DOCUMENTS 9,124,079 B2 * 9/2015 Takeuchi ............ B60R 16/0238
2006/0134403 A1   6/2006 Ohwaki et al.
(Continued)

FOREIGN PATENT DOCUMENTS

JP       2005-19103 A    1/2005
JP       2005-353542 A   12/2005
(Continued)

OTHER PUBLICATIONS

International Search Report (PCT/ISA/210) issued in PCT Application No. PCT/JP2014/080290 dated Feb. 24, 2015 with English-language translation (four (4) pages).
(Continued)

*Primary Examiner* — Andargie M Aychillhum
(74) *Attorney, Agent, or Firm* — Crowell & Moring LLP (57) ABSTRACT

There is a problem that contact resistance increases due to formation of an oxide film on a contact interface or biting of abrasion powder caused by micro-sliding when a contact connecting portion of a connection terminal including non-noble metal members is exposed to high temperature environment or a repetitious temperature cycle. An object of the present invention is to provide an in-vehicle electronic module that has connection reliability equivalent to that of the conventional in-vehicle electronic module even when being placed in the environment of an engine compartment and can achieve cost reduction by reducing the number of parts and assembly steps. The electronic module includes a mounting board having a circuit board on which an electronic component is mounted, and a case member for accommodating and protecting the mounting board from surrounding environment, The electronic module has a con-
(Continued)

nection structure in which a portion of the circuit board is protruded to the outside through an opening of the case and inserts a board terminal into an external female connector to obtain electrical continuity, and a portion of the case member forms a connector housing that receives the female connector and isolates a space in which the board terminal is present from surrounding environment and an insulating resin member for fixing the circuit board in the case is integrally molded or joined with the circuit board.

11 Claims, 9 Drawing Sheets (51) Int. Cl.
 H05K 1/11 (2006.01)
 H05K 3/28 (2006.01)
 H05K 3/34 (2006.01)
 B23K 35/26 (2006.01)
 B23K 35/02 (2006.01)
 B23K 1/00 (2006.01)
 B23K 1/08 (2006.01)
(52) U.S. Cl.
 CPC ...... *B23K 35/0222* (2013.01); *B23K 35/0244* (2013.01); *B23K 35/226* (2013.01); *B23K 35/26* (2013.01); *B23K 35/262* (2013.01); *H05K 1/117* (2013.01); *H05K 3/282* (2013.01); *H05K 3/3405* (2013.01); *H05K 3/3463* (2013.01); *H05K 5/003* (2013.01); *H05K 5/0034* (2013.01); *H05K 2201/015* (2013.01); *H05K 2201/10189* (2013.01); *H05K 2201/2045* (2013.01); *H05K 2203/122* (2013.01)

(56) References Cited

U.S. PATENT DOCUMENTS

2014/0151146 A1* 6/2014 Tanaka ............... B62D 5/0406
 180/443
2014/0234649 A1 8/2014 Kalich et al.

FOREIGN PATENT DOCUMENTS

| JP | 2006-9126 A | 1/2006 |
| JP | 2006-173059 A | 6/2006 |
| JP | 2010-37629 A | 2/2010 |
| JP | 2013-143202 A | 7/2013 |
| WO | WO 2013/045364 A2 | 4/2013 |

OTHER PUBLICATIONS

Japanese-language Written Opinion (PCT/ISA/237) issued in PCT Application No. PCT/JP2014/080290 dated Feb. 24, 2015 (four (4) pages).

* cited by examiner

CROSS SECTION TAKEN ALONG LINE A-A' OF FIG. 1

| CONNECTOR TERMINAL | | | CONNECTION TERMINAL | | PROTECTIVE COATING (KINETIC VISCOSITY (mm²/s)) | RELIABILITY |
|---|---|---|---|---|---|---|
| CORE MEMBER | BARRIER LAYER | SURFACE LAYER | CORE MEMBER | SURFACE MEMBER | | |
| Cu ALLOY | Ni/CuSn | Sn | Cu WIRING | Cu | NO COATING | × |
| | | | | | FLUORINE-BASED OIL (400) | × |
| | | | | Ni/Au PLATING | NO COATING | × |
| | | | | Sn PLATING | NO COATING | × |
| | | | | Sn-Cu SOLDER | NO COATING | × |
| | | | | Sn-3Ag-Cu SOLDER | NO COATING | △ |
| | | | | | SILICONE OIL (200) | △ |
| | | | | | SILICONE OIL (10⁵) | ○ |
| | | | | | FLUORINE-BASED OIL (400) | ○ |
| | | | | Sn-2Ag-Cu SOLDER | FLUORINE-BASED OIL (400) | ○ |
| | | | | Sn-3Ag SOLDER | FLUORINE-BASED OIL (400) | ○ |
| | | Sn-5Ag | | Sn-5Ag-Cu SOLDER | NO COATING | ○ |
| | | | | | SILICONE OIL (200) | ○ |
| | | | | | SILICONE OIL (10⁵) | ◎ |
| | | | | | FLUORINE-BASED OIL (400) | ◎ |
| | | | | Sn-5Ag SOLDER | FLUORINE-BASED OIL (100) | ◎ |

× NO RELIABILITY, △ LESS RELIABILITY, ○ ACCEPTABLE RELIABILITY, ◎ FAR MORE EXCELLENT THAN ACCEPTABLE RELIABILITY

FIG. 8

| CONNECTOR TERMINAL / PROTECTIVE COATING | CONNECTION TERMINAL | | | | | | RELIABILITY | |
|---|---|---|---|---|---|---|---|---|
| | CORE MEMBER | REACTION LAYER (A) | | SURFACE MEMBER (B) | | B/A | HIGH TEMPERATURE EXPOSURE | TEMPERATURE CYCLE |
| | | MATERIAL | FILM THICKNESS (μm) | SOLDER MATERIAL | FILM THICKNESS (μm) | | | |
| Cu ALLOY / Ni/CuSn / Sn-Ag / / FLUORINE-BASED OIL (PFPE) | Cu WIRING | CuSn | 1.0 | Sn-3Ag-Cu | 1.0 | 1 | × | × |
| | | | 0.5 | | 1.0 | 2 | × | ○ |
| | | | 2.0 | | 3.0 | 1.5 | ○ | × |
| | | | 1.5 | | 3.0 | 2 | ○ | ○ |
| | | | 1.0 | | 5.0 | 5 | ◎ | ◎ |
| | | | | | 10.0 | 10 | ◎ | ◎ |
| | | | 1.5 | Sn-5Ag-Cu | 5.0 | 5 | △ | △ |
| | | | | Sn-3Ag | 5.0 | 5 | ○ | ○ |
| | | | | Sn-5Ag | 5.0 | 5 | ○ | ○ |
| | Cu/Ni WIRING | NiSn | 0.5 | Sn-3Ag-Cu | 1.0 | 2 | × | △ |
| | | | 1.0 | | 2.0 | 2 | △ | △ |
| | | | | | 3.0 | 3 | ○ | ◎ |
| | | | | | 5.0 | 5 | ◎ | ◎ |
| | | | | | 10.0 | 10 | ◎ | ◎ |

IN-VEHICLE ELECTRONIC MODULE

TECHNICAL FIELD

The present invention relates to an in-vehicle electronic module that has a circuit board on which an electronic component is mounted, a protective member such as a case for accommodating and protecting the circuit board from surrounding environment, and a mating connector mechanism for connecting the circuit board and an external electric circuit.

BACKGROUND ART

As a background art of the present technical field, JP 2013-143202 A (PTL 1) can be mentioned. PTL 1 describes a structure including a circuit board on which an electronic component is mounted and a housing for accommodating the circuit board, wherein the housing has a connector accommodation space that accommodates and fixes a card edge connector for connecting a board connection terminal of the circuit board and an external wire harness, and an accommodation space of the circuit board, an end portion of the circuit board at which the board connection terminal is formed is protruded from the board accommodation space to the connector accommodation space, and is inserted into a board insertion space of the card edge connector, and the board connection terminal is brought into contact with the connector terminal and connected through a spring mechanism provided on a connector side. PTL 1 describes a mechanism in which relative displacement between the circuit board and the card edge connector or the like is avoided even when vibration or external force acting on electronic devices is applied. An example in which phosphor bronze is plated with Ni/Au as a material of the connector terminal is described, but there is no description about a material of the board connection terminal. On the other hand, JP 2006-9126 A (PTL 2) describes a material of the board connection terminal of the circuit board which is connected through the card edge connector. PTL 2 describes that, in a FPC board, a lead-free solder plating layer with a thickness of 0.2 μm to 2.0 μm is formed on a wiring circuit of a connector fitting part, a lead-free solder plating layer with a thickness of 2.0 μm or more is formed on a wiring circuit in a component mounting part of the FPC board to prevent deterioration of wettability due to the growth of Cu—Sn intermetallic compound, and the lead-free solder plating layer is heat-treated at a temperature of 140° C. to 180° C. for 1 hour, or at melting point temperature of solder or more for 0.1 second or more. PTL 2 describes an effect that prevents whiskers growing from a part in contact with the connector terminal in the connector mating part of the FPC board.

CITATION LIST

Patent Literatures

PTL 1: JP 2013-143202 A
PTL 2: JP 2006-9126 A

SUMMARY OF INVENTION

Technical Problem

A mating connector is a connector that inserts a connection terminal which is electrically connected to a circuit board of an electronic module into a connection terminal insertion space of a mating connector housing, interposes the connection terminal between connector terminals having a spring mechanism disposed in the connector housing, and both terminals are brought into contact with each other and connected to obtain electrical continuity. Accordingly, to obtain stable long-term electrical continuity in the mating connector it is important to: 1) hold contact pressure over a long period of time; 2) reduce sliding wear in a contact interface; and 3) prevent invasion and formation of foreign substances with high electrical resistance in a contact interface. At the same time, a mating connector in an in-vehicle electronic module is necessary to achieve cost reduction of products from its economic requests, so that a connector connecting member is required to be free from noble metals and achieve cost reduction in manufacturing process.

In PTL 1, to solve the problem of 2) increase in resistance due to sliding wear, a card edge connector that inserts a wiring terminal located at an end portion of a circuit board as a connection terminal to obtain an electrical connection is employed, and fixes a connector housing and the circuit board. Further, PTL 2 discloses that a terminal portion of FPC is plated with thin lead-free solder having a thickness of 0.5 μm to 2.0 μm to prevent corrosion, heat treatment is carried out to prevent occurrence of whisker in a connector mating portion, and a failure due to a short circuit between FPC board terminals. However, in PTL 1, as Ni/Au plating is exemplified as a material of a contact surface, there is no consideration about the cost of the connector member. Further, there is no description about long-term reliability in a case where the connector member is used in a severe environment such as an engine compartment of an automobile, and there is no reference about means and a method of obtaining long-term reliability by using materials other than noble metals. Further, in PTL 2, lead-free solder plating is selected as a metallized material for preventing corrosion of a board terminal, and the material is selected in consideration of environmental preservation and cost. However, the material configuration is not decided in consideration of reliability under environment such as high temperature, high-temperature and high-humidity, or a temperature cycle with a high temperature difference, like an automotive application. With a thin plating film of Sn or Sn based lead-free solder with a thickness of 0.5 μm to 2.0 μm, it is difficult to keep contact electrical resistance of a contact point at a small value of, for example, 10 mΩ or less under environment such as 150° C. long-term high-temperature exposure or a temperature cycle. Further, formation of a lead-free solder film by plating, management of plating liquid and treatment of waste liquid involve costs, so that the process cost cannot be reduced.

Conditions required for a mating connector joint part of an in-vehicle electronic module to obtain reliability includes 150° C. high temperature exposure resistance, 85° C./85% high-humidity and high-temperature resistance, temperature cycle resistance, mechanical vibration resistance, resistance to an environment in which the above conditions are combined, and resistance to an environment in which electrical operation is required, i.e., the mating connector joint part is necessary to be prevented from increasing its contact electrical resistance largely even when being placed in various severe environments. At the same time, another problem required to be solved in an in-vehicle electronic module is how to reduce the cost of materials to be used and manufacturing processes.

An object of the present invention is to provide an in-vehicle electronic module with high reliability in an electrical connection and a mating connector connection structure without performing expensive Au plating on a circuit board and mating connector parts and without largely increasing electrical resistance of a mating connector connecting portion over a long period of time even when being placed in harsh environment expected in an engine compartment.

Another object of the present invention is to provide a method of manufacturing a connection terminal and an in-vehicle electronic module at low cost and high productivity by forming an Sn-based solder layer, which forms Ag—Sn intermetallic compounds, on a surface of a connection terminal of a connector mating portion under use environment in the in-vehicle electronic module having a mating connector connection structure.

Solution to Problem

To achieve the above object, the present invention provides an in-vehicle electronic module in which an outermost surface of a connection terminal inserted into a mating connector to obtain electrical continuity includes a Sn-based solder layer containing an Ag—Sn intermetallic compound.

Advantageous Effects of Invention

As described above in detail, the outermost surface of the connection terminal, which is inserted into the mating connector to obtain electrical conduction, is formed of Sn-based solder containing an Ag—Sn intermetallic compound, and the Sn-based solder layer has a thickness of 3 µm or more, which is two times or more the thickness of an underlying layer and an Sn reaction layer, thereby making it possible to prevent electrical resistance of a contact connecting portion from increasing even when being placed under environment such as high temperature, high humidity, and a temperature cycle. Thus, a low-cost electron module with good sliding properties and high connection reliability can be provided without using a noble-metal plating member. Further, a wiring part at an end portion of the circuit board is used as the connection terminal, and as a metallized structure of the surface, a structure of Cu wiring/Cu—Sn reaction layer/Sn-based solder containing an Ag—Sn intermetallic compound is used. This makes it possible to remove a male connector member, thereby achieving miniaturization and cost reduction of the electronic module. At the same time, an in-vehicle electronic module with high long-term reliability can be provided. Furthermore, a connector connection structure is employed, in which a contact portion between the mating connector terminal and the connection terminal of the circuit board is coated and protected with liquid oil with a predetermined viscosity, which is stable thermally and chemically for a long period of time. This makes it possible to maintain the contact resistance at a low value for a long period of time even when the contact portion is exposed to high temperature environment and temperature cycle environment. Thus, an in-vehicle electronic module with high reliability and low loss can be provided.

DESCRIPTION OF EMBODIMENTS

Hereinafter, embodiments of the present invention will be described with reference to accompanying drawings.

Embodiment 1

In the present embodiment, an exemplary electronic module installed in an engine compartment of an automobile to control driving of an engine properly will be described.

Figure 1:
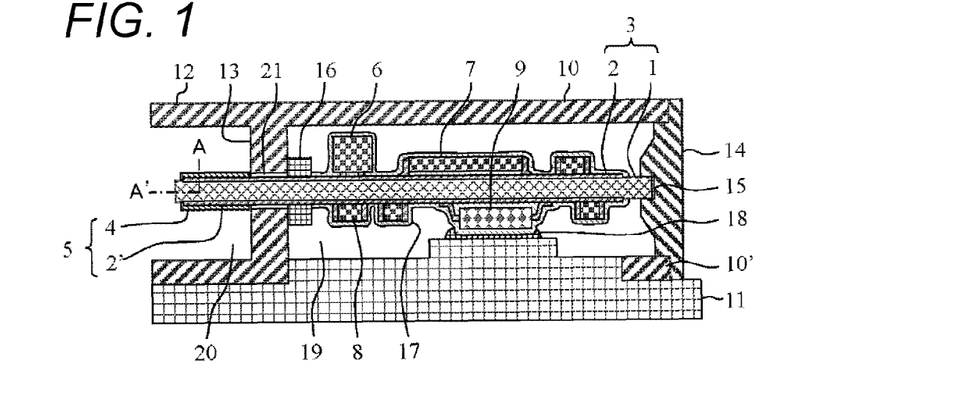
FIG. 1 is an exemplary configuration diagram of an in-vehicle electronic module with a metal heat dissipation member of a card edge connector structure.
Figure 2:
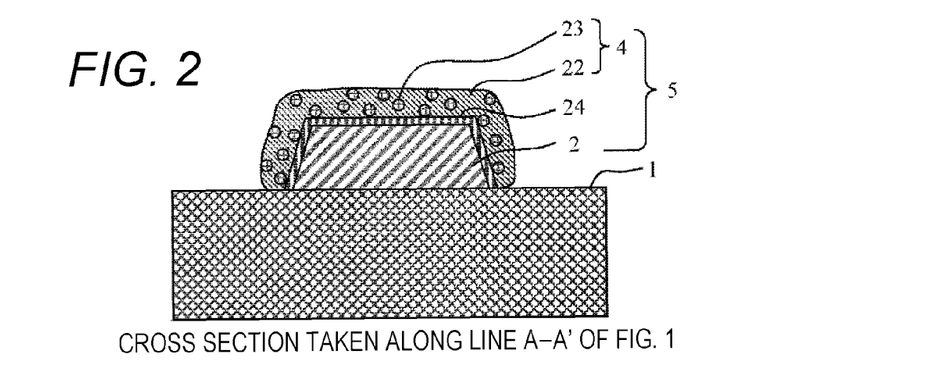
FIG. 2 is an exemplary cross-sectional view of a connection terminal formed on a circuit board of the in-vehicle electronic module.
Figure 3:
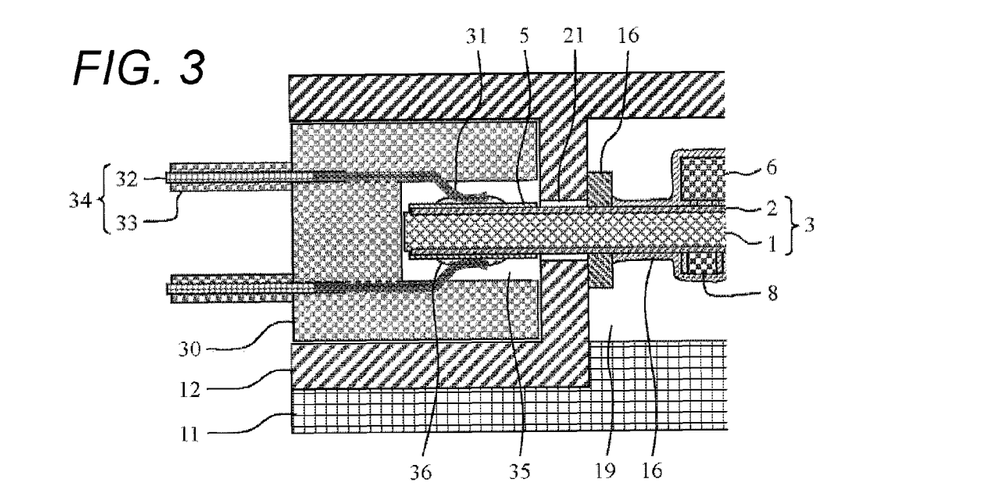
FIG. 3 is an exemplary cross-sectional structural view of a connecting portion between a connection terminal of a circuit board of the in-vehicle electronic module with the metal heat dissipation member and a card edge connector.
Figure 4:
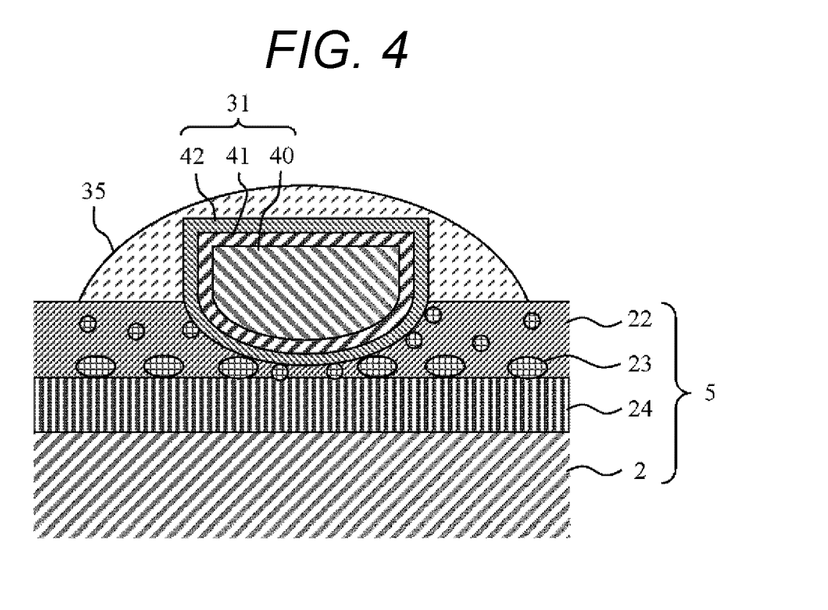
FIG. 4 is an exemplary cross-sectional view of the contact connecting portion between the connection terminal of the circuit board and the connector terminal.

FIG. 1 is an exemplary configuration diagram of an in-vehicle electronic module that has a card edge connector structure and uses a metal heat dissipating member. In the figure, on a circuit board 3 including an organic insulating substrate 1 and a Cu wiring 2, electronic components 6, 7, 8, 9 are mounted through solder joints, and an insulating member 16 is formed integrally between an electronic component mounting region and a connection terminal formation region. Further, a connection terminal 5 having a Cu wiring 2' coated with Sn-based solder 4 containing an Ag—Sn intermetallic compound is formed at an end portion of the board. After the electronic components are mounted on the circuit board and the insulating member is formed, the Sn-based solder is supplied by using a method of dipping into molten solder. An organic protection film 17 is formed on an upper and lower surfaces of the electronic component mounting region to cover the board and the electronic components. The organic protection film, which has humidity resistance and thermal conductivity, is formed of a resin with excellent heat-radiation properties. An electronic module case includes a metal heat dissipation member 11 made of an Al die casting, a resin case 10 for protecting the circuit board from outside air, and a rear cover 14, and has a connector accommodation part 12 for accommodating and fixing a card edge connector. A resin wall 13 interrupts between a connector accommodation space 20 and a circuit board accommodation space 19. An opening 21 is provided to protrude a connection terminal 5 from the circuit board accommodation space to the connector accommodation space. The insulating member formed integrally with the circuit board is in close contact with the resin wall and fixed to interrupt both of the spaces from each other, thereby protecting a mounting region of the circuit board and preventing outside air from invading. A rear end of the circuit board is inserted into a board insertion groove 15 provided in the rear cover 14 and fixed. Although not shown, side ends of the circuit board are fixed in a similar structural manner, thereby improving resistance to mechanical vibration. Further, an electronic component 9 with large heat generation is thermally connected to a metal heat dissipation member 11 through a high thermal conductive grease 18, thereby ensuring a heat dissipation path. FIG. 2 illustrates an exemplary cross-sectional view of a connection terminal 5. In the figure, the Cu wiring 2 is coated with the Sn-based solder 4 containing an Ag—Sn intermetallic compound 23 to form a reaction layer 24 of Cu and Sn at an interface. The Sn-based solder layer has a thickness of 3 µm to 10 µm, and the CuSn reaction layer has a thickness of approximately 1 µm. Ag—Sn intermetallic compounds are dispersed substantially uniformly in the Sn solder layer. FIG. 3 is an exemplary cross sectional structure of a connecting portion when the card edge connector is attached to the in-vehicle electronic module of FIG. 1. In the figure, a card edge connector 30 has a plurality of pairs of connector terminals 31 having spring properties, and a card insertion space 35 for inserting a terminal portion of the circuit board is formed. Further, the connector terminal is coupled to a wire harness 34 composed of a metal conductor 32 and an insulating coating material 33. The card edge connector is pushed into the connector accommodation space of the electronic modules up to the resin wall and connected. The connection terminal 5 pushed into the card insertion space is mechanically pressed by a force determined by the spring properties of the connector terminal, so that electrical continuity is ensured. Both contact portions are coated with thermally and chemically stable liquid oil 36 to be protected. FIG. 4 shows an exemplary cross-sectional structure of a contact connecting portion between the connector terminal and the connection terminal. In the figure, the connector terminal 31 has a structure in which an Sn plating film 42 is formed on a Cu alloy core 40, which has excellent spring properties and conductivity, via a barrier layer 41. The barrier layer includes one layer or two layers including a Ni film. The Sn-based solder layer of the connection terminal 5 is formed of a soft thick film. Therefore, from the point at which the connector terminal is pressed, the Sn-based solder layer is recessed to be contacted. The recess is increased with time by creep deformation. At a contact interface of the connection terminal, soft Sn-based solder is reduced and a ratio of hard Ag—Sn intermetallic compound 23 tends to be increased gradually. Liquid oil 35 serving as a protective coating agent employs a thermally and chemically stable oil material capable of maintaining a liquid state for a long period of time. Thus, a coating film is formed to fill a gap between the contact interfaces or a recessed portion around the interface by using its surface tension, so that the contact surface is isolated from moisture and oxygen of outside air. Here, perfluoropolyether (PFPE) with large viscosity, a mixture of PFPE and polytetrafluoroethylene (PTFE), and silicone oil whose molecular size is large are employed. Note that, since the liquid oil has no influence on the contact pressure of the connector terminal, a metal contact state of the connector terminal and the connection terminal are not affected.

According to the present embodiment, a connector accommodation part integrally molded with a resin case is formed. A connection terminal formed at an end portion of the circuit board is protruded into the connector accommodation space from the resin wall, thereby having a function of a male connection terminal. Therefore, a male connector member can be eliminated, so that downsizing and cost reduction of the in-vehicle electronic module is achieved. Further, the connection terminal has a structure in which a Cu wiring is dipped and coated with Sn-based solder containing an Ag—Sn intermetallic compound, the Sn-based solder has a thickness of 3 µm or more, which is two times or more the thickness of an underlying layer and an Sn reaction layer, and the contact portion is coated with thermally and chemically stable oil to be protected. Thus, even when micro sliding occurs repeatedly at a contact portion between both of the terminals due to a temperature cycle and mechanical vibrations, an amount of abrasion powder caused by the micro sliding can be reduced and at the same time the abrasion powder is prevented from biting in the interface, thereby making it possible to provide an in-vehicle electronic module with resistance to a temperature cycle and mechanical vibrations. Even when being exposed to high temperature environment, the metal contact portion is isolated from moisture and oxygen of outside air by the oil serving as a protect coating, so that the progress of oxidation is prevented. This reduces an increase in electric resistance due to the formation of an oxide film in the connector connecting portion. Thus, an in-vehicle electronic module with high connection reliability under high temperature environment can be provided. That is, even when being placed under harsh environment such as inside an engine compartment, a compact and low cost in-vehicle electronic module with high connection reliability can be provided.

Figure 5:
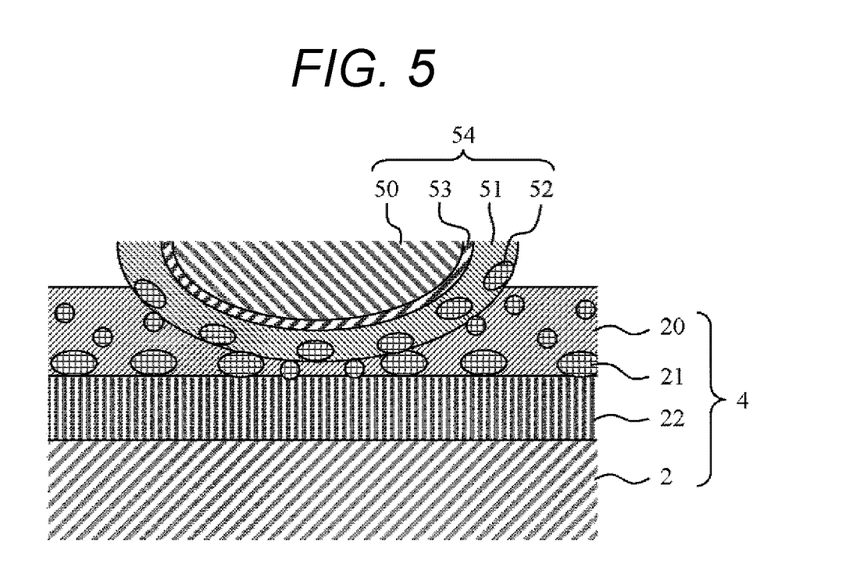
FIG. 5 is another exemplary cross-sectional view of the contact connecting portion between the connection terminal of the circuit board and the connector terminal.

FIG. 5 is another embodiment of a cross sectional structure of the connector connecting portion when the card edge connector is attached to the in-vehicle electronic module. In the figure, a connector terminal 54 is configured such that a Sn-based solder layer 51 containing an Ag—Sn intermetallic compound 52 is formed on a Cu alloy core 50 having excellent spring properties via a diffusion barrier layer 53.

On the other hand, a Sn-based solder layer 20 containing an Ag—Sn intermetallic compound 21 is also formed on the outermost surface of the connection terminal 4. At a contact interface between both of the terminals, the Ag—Sn intermetallic compound of one terminal is exposed to one surface and is in contact with the other surface of the other terminal, and a contact portion between the Ag—Sn intermetallic compounds is also formed.

According to the present embodiment, since the hardly-oxidized Ag—Sn intermetallic compound with low electrical resistance has a larger contact area at the contact interface, connection resistance is maintained low over a long period of time to provide a connector connection structure with high reliability.

Figure 6:
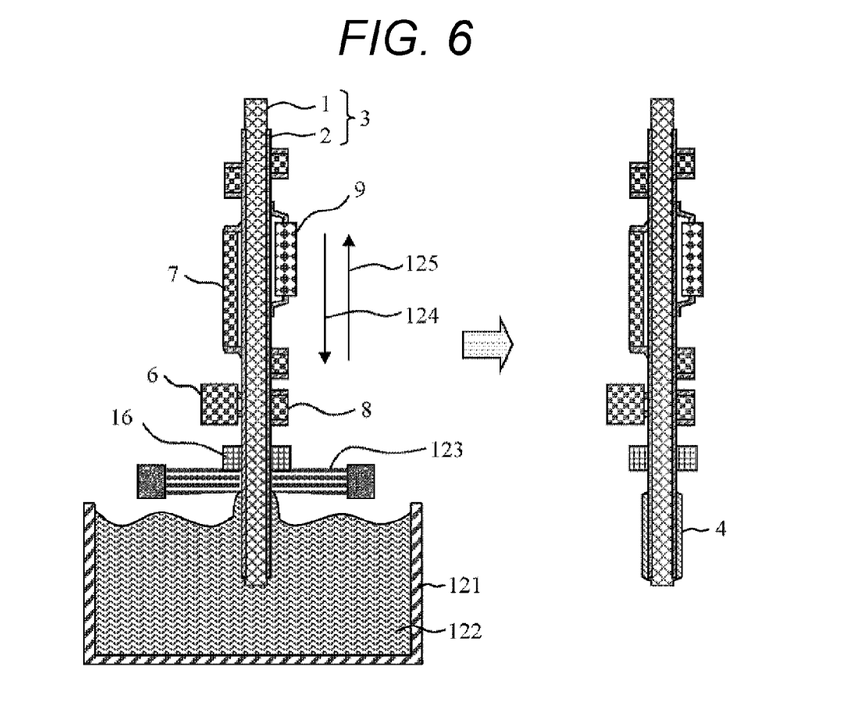
FIG. 6 is an exemplary diagram showing a relationship between constituent materials of a connecting portion between the connection terminal of the circuit board and the connector terminal and reliability.

FIG. 6 is an exemplary method of forming the connection terminal 5 at an end portion of the circuit board in FIG. 1. In the figure, the electronic components 6, 7, 8, 9 are mounted on the circuit board 3, and the insulating member is formed integrally. The end portion of the board, which is located on a tip end side of the circuit board viewed from the insulating member, is immersed briefly in molten solder of a solder bath 121 to wet the Cu wiring with solder, and then lifted up. A leveling brush 123, which is disposed at a lifting part, sweeps off excessive molten solder, thereby adjusting a thickness of the attached solder.

According to the present embodiment, with respect to the circuit board on which the electronic components are mounted, a thick solder layer is allowed to be formed on the connection terminal part with good mass productivity without having a large thermal influence on the mounted area or without employing expensive facilities. This makes it possible to manufacture the circuit board equipped with a board terminal for connecting the card edge connector at low cost. A thickness of the solder layer can be controlled by adjusting the gap between the leveling brush and the circuit board.

Embodiment 2

In the present embodiment, exemplary reliability evaluation results will be described in the case where a surface material of the connector terminal, a surface material of the connection terminal, film thickness and a surface material of the protect coating film are changed.

Figure 7:
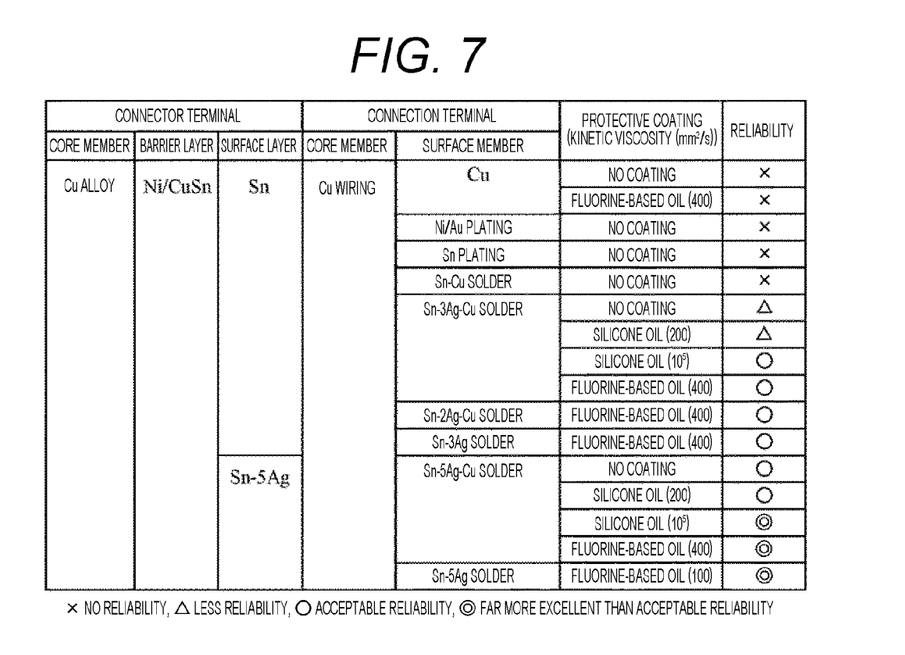
FIG. 7 is an exemplary configuration diagram of an in-vehicle electronic module of a resin case type of a card edge connector structure.

FIG. 7 shows a reliability evaluation result in the case where a surface material of the connector terminal, a surface material of the connection terminal, and a material of the protect coating film is changed. In the case where a surface of the connector terminal is made of Sn, when Cu, Ni/Au, Sn plating, and Sn—Cu solder with no protect coating are employed as the surface material of the connection terminal, no reliability is obtained. When fluorine-based oil serving as a protective coating agent is applied on Cu which is easily oxidized, no reliability is also obtained. For Sn-3Ag-Cu solder in which an Ag—Sn intermetallic compound is formed, when no protect coating is provided, acceptable reliability is not obtained. However, when high-viscosity silicone oil or fluorine-based oil is applied, acceptable reliability is obtained. Even when Sn-2Ag-Cu solder or Sn-3Ag solder is employed instead of the Sn-3Ag-Cu solder, if fluorine-based oil is applied, acceptable reliability is obtained. In the case where Sn-5Ag is employed as the surface material of the connector terminal, when Sn-5Ag-Cu solder is employed as the surface material of the connection terminal, acceptable reliability is obtained even when no protect coating is provided. Further, when high-viscosity silicone oil or fluorine-based oil of perfluoropolyether is employed, high reliability is obtained. Likewise, for Sn-5Ag solder, high reliability is obtained.

Figure 8:
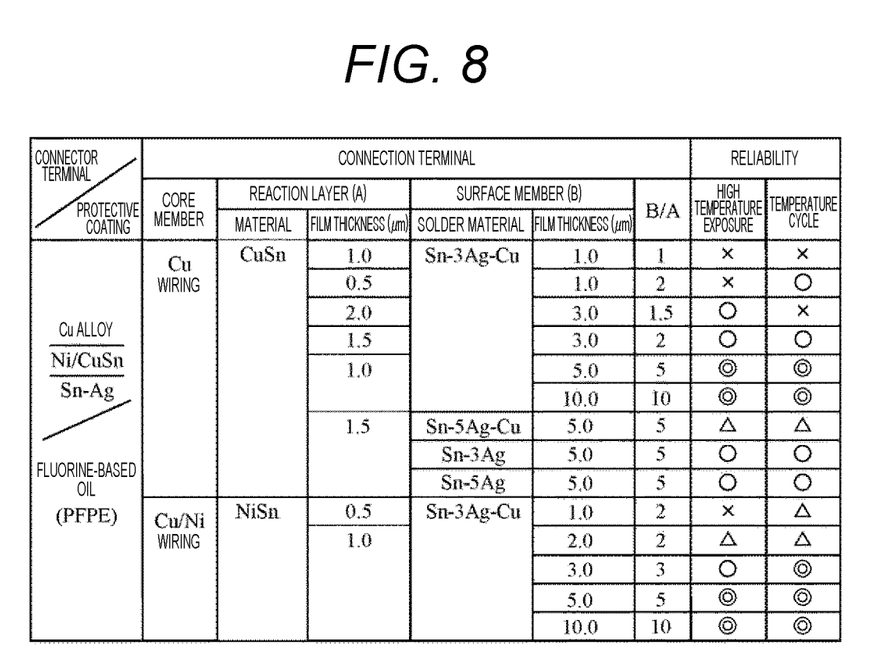
FIG. 8 is an exemplary cross-sectional structural view showing a connecting portion between the connection terminal of the circuit board in the in-vehicle electronic module of a resin case type and a card edge connector.

FIG. 8 shows reliability evaluation results in high-temperature exposure and a temperature cycle test, in the case where Sn—Ag is employed as a surface material of the connector terminal and fluorine-based oil is employed as a protective coating agent, when a material of the connection terminal and a thickness of the reaction layer and the solder layer are changed. In the case where Sn-3Ag-Cu solder with a thickness of 1.0 μm to 10.0 μm is formed on the Cu wiring and a CuSn reaction layer with a thickness of 1.0 μm to 2.0 μm is employed as the connection terminal, when a ratio of thickness (B) of the solder layer to thickness (A) of the reaction layer is less than 2, no reliability is obtained in a temperature cycle. When the thickness of the solder is less than 3.0 μm, reliability is not obtained in high temperature exposure. As a connection terminal specification for satisfying both reliabilities, a ratio of the thickness of the Sn-based solder layer containing an Ag—Sn intermetallic compound to the thickness of the reaction layer is 2 or more, and a thickness of the solder layer is 3.0 μm or more. When an Ni-plated Cu wiring is employed as a core member of the connection terminal, the reaction layer is a NiSn layer. However, a relation between a thickness ratio of the reaction layer and the solder layer or a relation to a thickness of the solder can be deemed as similar to those of the Cu wiring, although shifted slightly to a thinner side.

According to the present embodiment, a Sn-based solder containing an Ag—Sn intermetallic compound is employed as a surface material of the connection terminal, a thickness ratio of the reaction layer and the solder layer of the connection terminal is 2 or more, and a thickness of the solder layer is 3.0 μm or more, so that it is confirmed that good reliability results are obtained in both high-temperature exposure and a temperature cycle.

Embodiment 3

In the present embodiment, as an example, a resin case type of electronic module that is installed in an engine compartment of an automobile and controls driving of an engine properly will be described.

Figure 9:
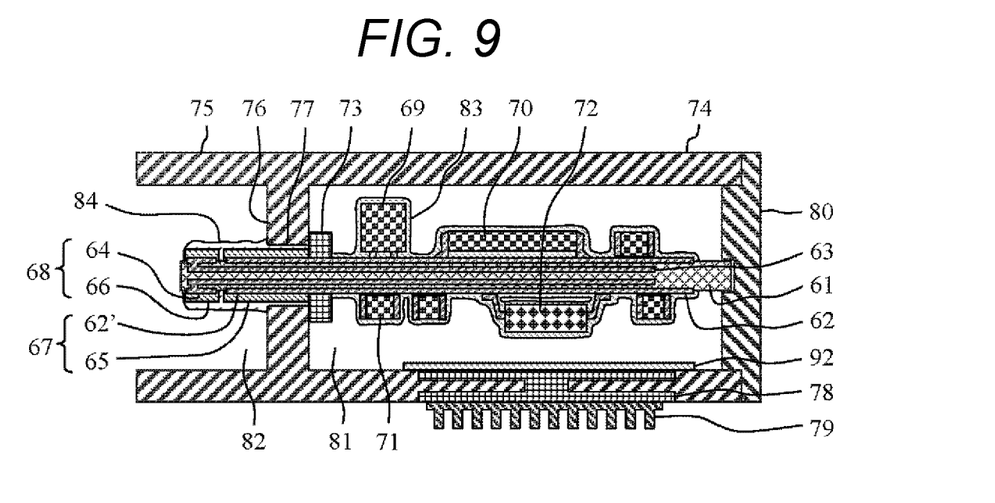
FIG. 9 is an exemplary configuration diagram of the in-vehicle electronic module of a resin mold type of the card edge connector structure.
Figure 10:
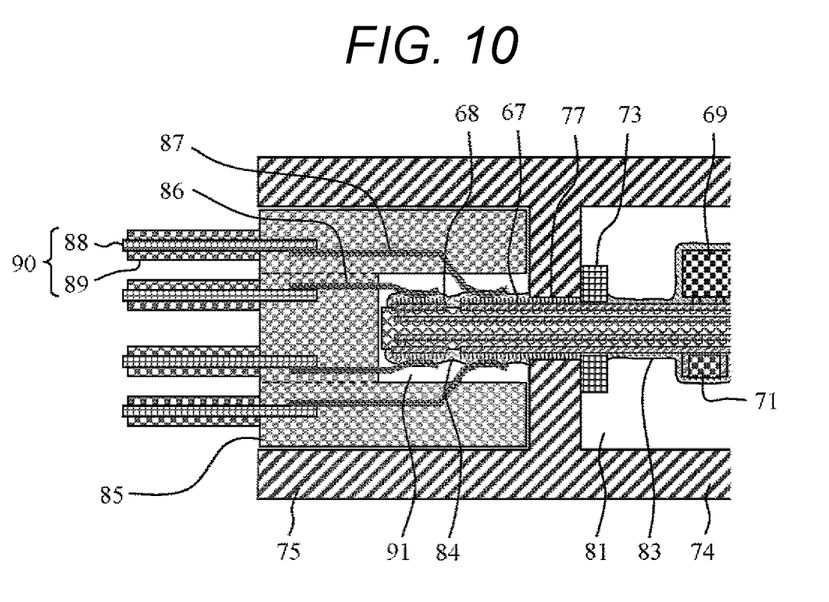
FIG. 10 is an exemplary cross-sectional structural view showing a connecting portion between the connection terminal of the circuit board in an in-vehicle electronic module of a resin mold type and the card edge connector.

FIG. 9 is an exemplary configuration diagram of an in-vehicle electronic module of a resin case type with a card edge connector structure. In the figure, on a circuit board including an organic insulating substrate 61 and a Cu wiring 62, electronic components 69, 70, 71, and 72 are mounted through solder joints, and an insulating member 73 is formed integrally between an electronic component mounting region and a connection terminal formation region. Further, at an end portion of the board, connection terminals 67, 68 in which Cu wirings 62' and 64 are coated with Sn-based solder 65 and 66 containing an Ag—Sn intermetallic compound are formed. After the electronic components are mounted on the circuit board and the insulating member is formed, the Sn-based solder is supplied by using a method of dipping into molten solder. On an upper and lower surfaces of the electronic component mounting region, an organic protection film 83 is formed so as to cover the board and the electronic components. The organic protection film is formed of a resin with humidity resistance and thermal conductivity that is excellent in heat radiation properties. In a resin case 74 of the electronic module, a heat dissipation path member 78 for conducting heat within the case to the outside is integrally incorporated by injection molding. To increase adhesiveness with the injection molding resin, a surface of the heat dissipation path member is turned into Zn and roughened. A cooling fin 79 is attached to an outer surface of the heat dissipation path member. A rear side of the resin case is sealed with a rear lid 80. The circuit board is inserted into an opening 77 from the rear side of the resin case, and the connection terminal is protruded to a connector accommodation space 82 from the opening 77. An insulating member 73 adheres to the resin wall 76 to fix a front side of the circuit board. In the process of being sealed with the rear lid 80, the circuit board is inserted into a board insertion groove and the rear side of the circuit board is fixed. The heat dissipation path member is disposed at a position facing an electronic component 72 with large heat generation. On a surface of the heat dissipation path member, a coating film 92, which is easy to absorb radiant heat and has excellent thermal conductivity, is formed. FIG. 10 is an exemplary cross sectional structure of the connecting portion when a card edge connector is attached to the in-vehicle electronic module of FIG. 9. In the figure, a card edge connector 85 has multiple pairs of connector terminals 86 and 87 each having spring properties, and a card insertion space 91 for inserting a terminal portion of the circuit board is formed. Further, the connector terminal is coupled to a wire harness 90 including a metal conductor 88 and an insulating coating material 89. The card edge connector is pushed into a connector accommodation space of the electronic module up to the resin wall and connected. The connection terminals 67 and 68 are pushed into the card insertion space and mechanically pressed by a force determined by the spring properties of the connector terminal, so that electrical continuity is ensured. A contact portion between both of the terminals is coated with thermally and chemically stable liquid oil 84 to be protected.

According to the present embodiment, a compact and low-cost in-vehicle electronic module with high reliability in connector connection can be provided as in Embodiment 1. Further, even when a circuit board of the in-vehicle electronic module, which includes a multilayer structure and requires the large number of connection terminals, the number of connection terminals can be increased twice at the same wiring pitch by using two-stepped arrangement of the connection terminals at the end portion of the board. Thus, a high-functioning in-vehicle electronic module in which a plurality of electronic module functions are incorporated into a single electronic module can be provided. Furthermore, by integrally incorporating the heat dissipation path member for radiating heat within the module to the outside during the injection molding of resin case and treating the surface of the heat dissipation path member to have high adhesiveness to a resin of the case, the resin case that is easily manufactured at low cost and excellent in heat dissipation can be provided. At the same time, the in-vehicle electronic module that prevents the heat dissipation path member made of metal from peeling off a resin of the case and is excellent in air-tightness of the resin case can be provided.

Embodiment 4

In the present embodiment, as an example, an in-vehicle electronic module of a resin mold type in which a mounting region of the circuit board is sealed with a thermosetting resin will be described.

Figure 11:
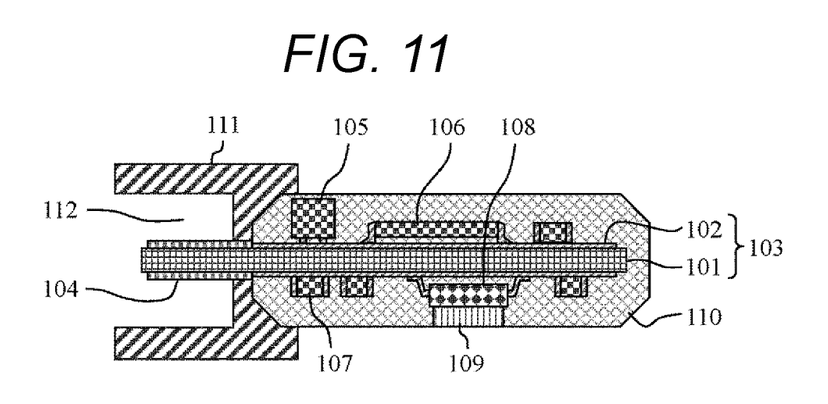
FIG. 11 is an exemplary diagram showing a relationship between a surface material of the connection terminal and an increase in resistance due to high temperature exposure.
Figure 12:
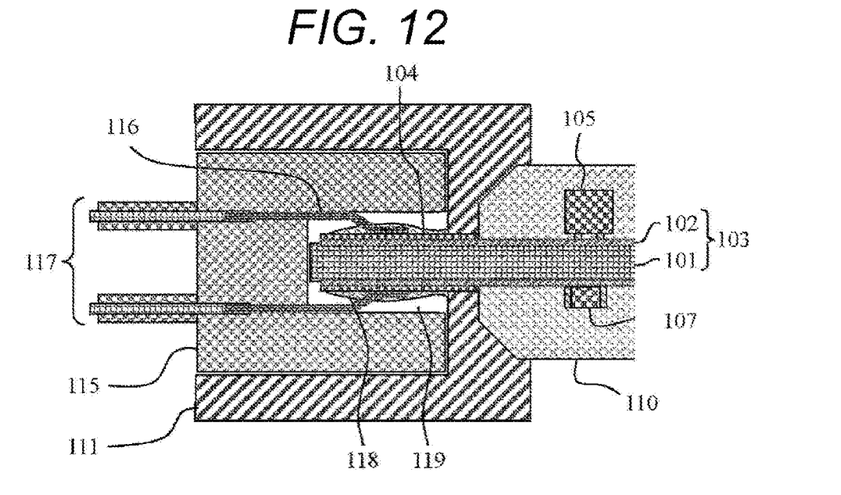
FIG. 12 is an exemplary cross-sectional structure of a Cu connection terminal at a connector terminal contact position after high temperature exposure.

FIG. 11 is an exemplary cross-sectional structure of an in-vehicle electronic module in which a card edge connector accommodating member is incorporated with an electronic module of a resin mold type. In the figure, electronic components 105, 106, 107 and 108 are mounted on a circuit board 103 including an organic insulating substrate 101 and a Cu wiring 102 through solder joints, and a high thermal conduction member 109 is fixed to an electronic component 108 with a large amount of heat generation. A mounting region of the circuit board is molded in the state where all of the electronic components are covered with a thermosetting sealing resin 110 on both front and back sides thereof. A connection terminal 104 having a Cu wiring dip-coated with Sn-based solder containing an Ag—Sn intermetallic compound is formed on an end portion of the board exposed from the mold resin. A connector accommodating member 111 for accommodating and fixing the card edge connector is integrally formed with the mold resin so as to cover the end portion of the board. The connector accommodating member is formed of a thermoplastic resin by injection molding after formation of a mold-connection terminal. The reference sign 112 indicates a connector accommodation space. FIG. 12 is an exemplary cross sectional structure of the connecting portion when a card edge connector is attached to the in-vehicle electronic module of FIG. 11. In the figure, a card edge connector 115 has a plurality of pairs of connector terminals 116 each having spring properties. A card insertion space 119 for inserting a terminal portion of the circuit board is formed. A connector terminal is coupled to a wire harness 117 including a metal conductor and an insulating coating material. The card edge connector is pushed into a connector accommodation space of the electronic module up to the resin wall and connected. The connection terminal 114, which is pushed into the card insertion space, is mechanically pressed by a force determined by the spring properties of the connector terminal, so that electrical continuity is ensured. A contact portion between both of the terminals is coated with thermally and chemically stable liquid oil 118 to be protected.

According to the present embodiment, the circuit board of the electronic module is molded with a thermosetting sealing resin to have the substantially same height as the mounted electronic components. Thus, a case member for protecting the circuit board can be eliminated, thereby achieving a significant downsizing of an electronic module body. Further, the solder joints of the electronic components are fixed by a contractile force of the sealing resin and a compressive stress is applied. This improves a thermal fatigue life of the solder joints greatly, thereby making it possible to provide an in-vehicle electronic module having high reliability in the circuit board mounting portion. At the same time, as in the case of Embodiment 1, a compact and low cost in-vehicle electronic module having a connection structure with high reliability in connector connection can be provided.

Figure 13:
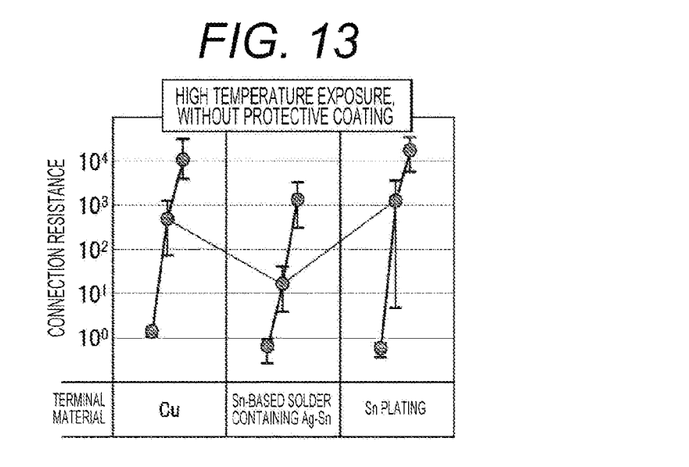
FIG. 13 is an exemplary cross-sectional structure of an Sn connection terminal at a connector terminal contact position after high temperature exposure.
Figure 14:
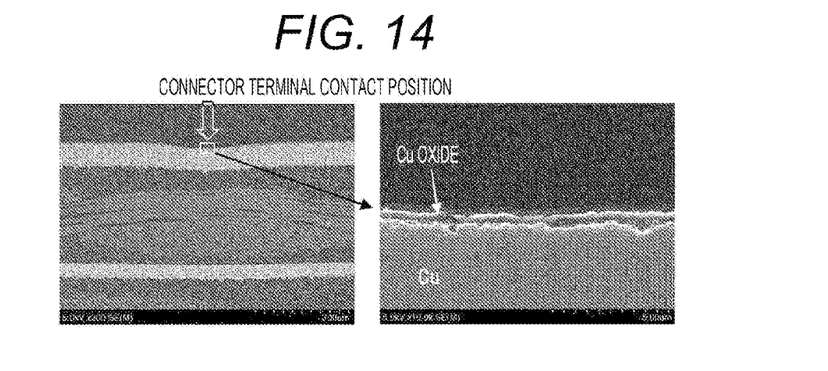
FIG. 14 is an exemplary cross-sectional structure of an initial Sn-based solder terminal containing an Ag—Sn intermetallic compound.
Figure 15:
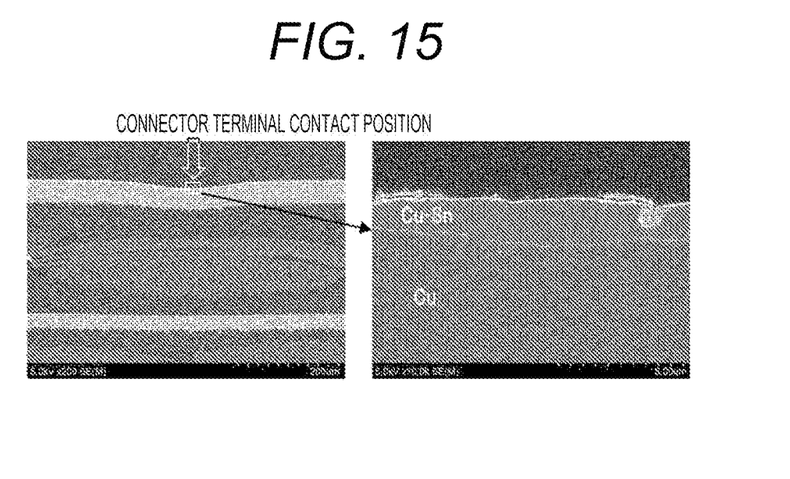
FIG. 15 is an exemplary cross-sectional structure of the Sn-based solder terminal containing an Ag—Sn intermetallic compound at a connector terminal contact position after high temperature exposure.
Figure 16:
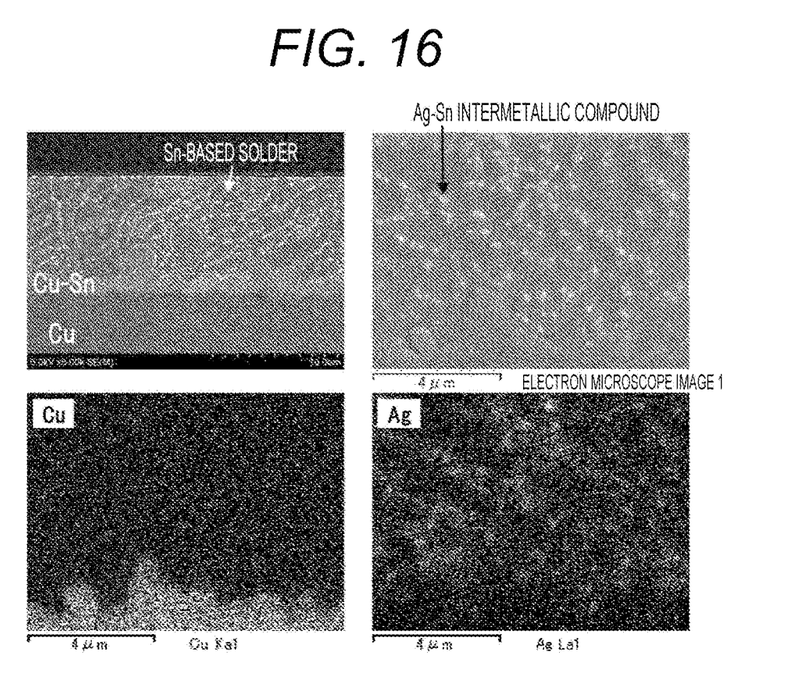
FIG. 16 is an exemplary diagram showing a relationship between a protective coating material in the Sn-based solder terminal containing an Ag—Sn intermetallic compound and an Sn-plated terminal, and an increase in resistance due to high temperature exposure.
Figure 17:
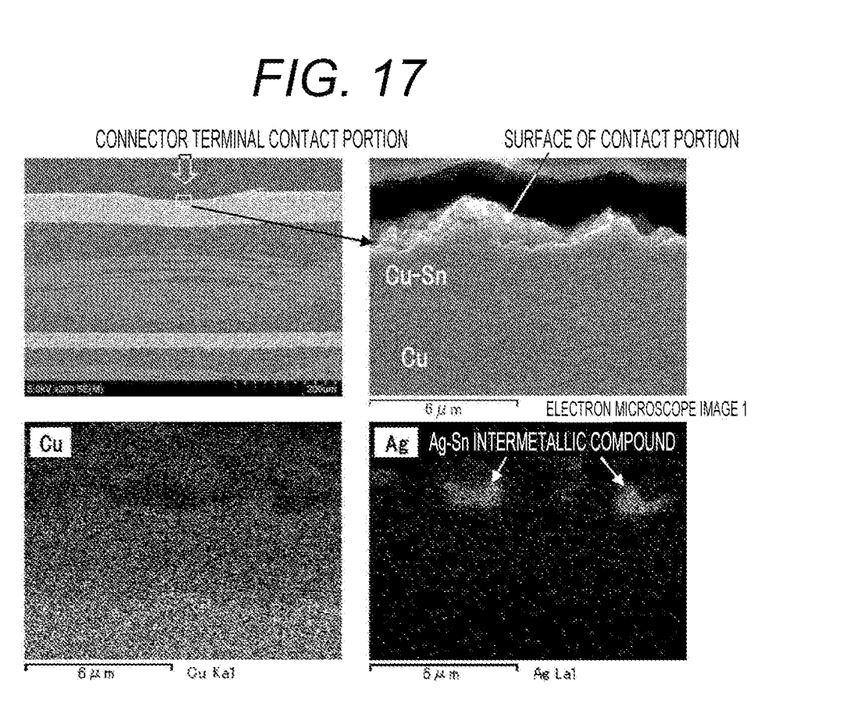
FIG. 17 is an exemplary diagram showing a relationship between a protective coating material in the Sn-based solder terminal containing an Ag—Sn intermetallic compound and the Sn-plated terminal, and an increase in resistance due to a temperature cycle test.

Furthermore, the present embodiment can be expressed as follows. That is, Sn-based solder containing an Ag—Sn intermetallic compound is used for the outermost surface of the connection terminal to be connected to a mating connector of the in-vehicle electronic module. Thus, when the connector terminal is pressed to the connection terminal by a strong force, soft Sn-based solder is extruded therearound by a creep deformation. This causes the state where a hard and hardly-oxidized Ag—Sn intermetallic compound remains at a connecting point portion and comes into contact with the connector terminal, so that the increase in resistance due to the formation of an oxide layer at the contact interface is prevented to maintain low resistance. FIG. 13 shows variations in contact resistance when a surface material of the connection terminal was changed and a high-temperature exposure test was carried out. When resistance values are compared at the same condition of exposure time (plotted points connected by a broken line), a Sn-based solder terminal containing an Ag—Sn intermetallic compound is controlled to have a low resistance value as compared with a Cu and Sn terminals. FIG. 14 is a cross-section of the Cu terminal after high-temperature exposure. It is confirmed that an oxide layer is formed on a surface of the Cu terminal at the contact portion. FIG. 15 is a cross-section of the Sn terminal after high-temperature exposure. A Cu3Sn intermetallic compound appears at the contact portion. This estimates that Cu oxide is formed on the surface. FIG. 16 is a cross-section of the Sn-based solder terminal containing an Ag—Sn intermetallic compound before a high-temperature exposure test. It shows that Ag—Sn intermetallic compounds are uniformly dispersed in a matrix of Sn-based solder. FIG. 17 is a cross-section of the Sn-based solder terminal containing an Ag—Sn intermetallic compound after a high-temperature exposure. It shows that Ag—Sn intermetallic compounds are present on a terminal surface of the contact portion. That is, even when soft Sn-based solder is extruded therearound by a pressing pressure of the connector terminal, Ag—Sn intermetallic compounds remain at the contact interface and maintain in contact with the connector terminal, thereby contributing to a reduction in contact resistance. In other words, it can be said that Sn-based solder containing an Ag—Sn intermetallic compound is the most suitable for a surface material of the connection terminal in the mating connector. Even when the underlying layer is formed of a material other than Cu, the same effect will be obtained as long as oxidizable metal is used.

Further, the present embodiment employs an in-vehicle electronic module in which an Sn-based solder layer containing an Ag—Sn intermetallic compound, which serves as the outermost surface of the connection terminal, has a thickness of two times or more the thickness of an underlying conductive material of the connection terminal and a Sn reaction layer.

The connection terminal of the in-vehicle electronic module is subjected to thermal histories such as a plurality of times of solder reflows in assembly processes. At that time, Sn-based solder serving as a surface layer is reacted with the underlying layer to form and grow a hard reaction layer. When the soft Sn-based solder layer is changed to the hard reaction layer, a recess area of the contact point is reduced, thereby decreasing a contact area with the connector terminal and increasing the contact resistance. When a soft Sn-based solder layer having a thickness of two times or more the thickness of the hard reaction layer serving as an underlying layer is provided, the soft Sn-based solder is easily deformed despite the rigidity of the underlying layer, so that the contact area is enlarged to obtain low contact resistance. Further, when the mating connector is inserted and removed, the contact surface on a connector terminal side is controlled to have small sliding wear. Thus, repetitious insertion and removal properties and reliability are improved.

Furthermore, the present embodiment employs the in-vehicle electronic module in which a Sn-based solder layer containing an Ag—Sn intermetallic compound serving as the outermost surface of the connection terminal is formed to have an average thickness of 3 µm or more.

When a thin Sn-based solder layer having a thickness of 2 µm or less is employed, the Sn-based solder layer is turned into a Cu3Sn intermetallic compound up to the outermost surface under a high-temperature exposure condition of 150° C.-2000 h, so that oxidation is easily progressed to increase contact resistance. However, when the thickness of the Sn-based solder layer is increased to 3 µm or more, Cu6Sn5 remains in the surface layer even under the condition of 150° C.-2000 h, so that oxidation is hard to be progressed. Additionally, an Ag—Sn intermetallic compound is formed, and an increase in contact resistance is prevented. Although there is no upper limit for the thickness of the Sn-based solder layer, the upper limit can be practically determined to be several hundred micrometers in consideration of a thickness of the connection terminal enough to be inserted into the mating connector and a movable range of a typical connector terminal.

Further, in the present embodiment, the in-vehicle electronic module includes a circuit board on which electronic components are mounted, a box-shaped case or a protective member made of a mold resin that accommodates and protects the circuit board from surrounding environment, and a connector accommodating member that is integrally formed with the protective member and has a space for accommodating the mating connector. The in-vehicle electronic module has a structure in which an end portion of the board, which has the connection terminal of the circuit board therein, is protruded from the protective member into the connector accommodation space and the end part of the board is inserted into the mating connector to obtain electrical continuity. The in-vehicle electronic module has a structure that has a connection terminal formed of Cu wiring/Cu—Sn reaction layer/Sn-based solder layer containing an Ag—Sn intermetallic compound.

Furthermore, in the in-vehicle electronic module, the Sn-based solder layer containing an Ag—Sn intermetallic compound of the connection terminal has a thickness of two times or more the thickness of the Cu—Sn reaction layer.

Still furthermore, in the in-vehicle electronic module, the Sn-based solder layer containing an Ag—Sn intermetallic compound of the connection terminal is formed to have a thickness of 3 µm or more.

Since the connection terminal of the in-vehicle electronic module is formed of the wiring located at the end portion of the circuit board, a male connector member required for connection to the outside can be eliminated, thereby making it possible to achieve cost reduction by miniaturizing the electronic module or reducing the number of parts. There is a problem that, in the case where the Cu wiring located on the organic substrate at the end portion of the circuit board is employed as the connection terminal, if the contact connecting portion with the mating connector is exposed to harsh environments such as heat, humidity, and vibrations, connection resistance will be increased to cause abnormal operation of the electronic module. However, when Sn-based solder containing an Ag—Sn intermetallic compound is employed as a surface material of the connection terminal and the thickness of the Sn-based solder layer is 3 µm or more, which is two times or more the thickness of Cu—Sn reaction layer, the contact resistance can be maintained low under environments such as high temperature, high humidity, and temperature cycling, so that repetitive sliding properties and long-term reliability can be obtained. Thus, a compact and low-cost in-vehicle electronic module with high reliability can be provided.

Further, in the present embodiment, the in-vehicle electronic module has a structure in which chemically stable oil which maintains a liquid state over a long period of time under use environment and does not corrode Sn-based alloy or Cu is applied on a surface of the connection terminal of the in-vehicle electronic module that is inserted into a mating connector to obtain electrical conduction.

Furthermore, in the present embodiment, in a contact connection structure between the connection terminal of the in-vehicle electronic module and the connector terminal of the mating connector connected to an external wiring, the in-vehicle electronic module has such a connector connection structure in which Sn-based solder containing an Ag—Sn intermetallic compound is employed as a surface material of the connection terminal and a chemically stable oil, which maintains a liquid state over a long period of time under use environment and does not corrode Sn-based alloy or Cu, is applied to cover the contact connecting portions between the connection terminal and the connector terminal.

Figure 18:
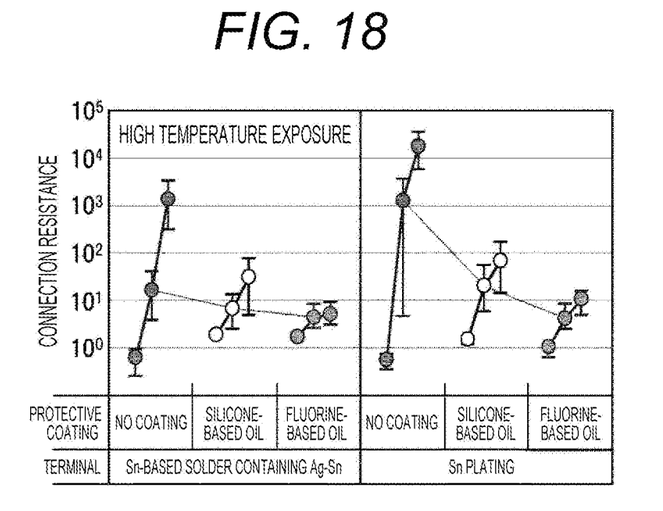
FIG. 18 is a change in contact resistance when high temperature exposure test is carried out.
Figure 19:
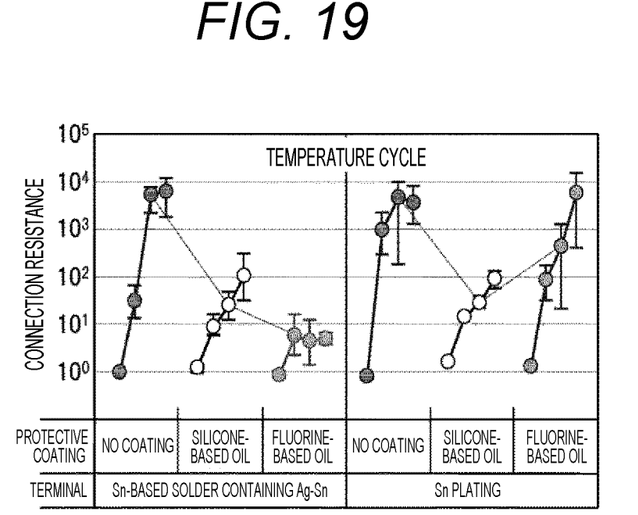
FIG. 19 is a change in contact resistance when a temperature cycle test is carried out.

When a chemically stable oil with medium viscosity or more, which maintains a liquid state over a long period of time and does not corrode metal, is applied on the contact portion between the connection terminal and the connector terminal as a protective coating agent, there are obtained effects that a metal surface of the contact portion is prevented from being oxidized, and further sliding wear is reduced, or abrasion powder is prevented from biting when the contact surface slightly slides. Consequently, an effect that contact resistance is prevented from increasing over a long period of time can be obtained. FIG. 18 shows variations in contact resistance when fluorine-based oil and silicone-based oil are applied as a protective coating agent and a high-temperature exposure test is carried out in the case where Sn-based solder containing an Ag—Sn intermetallic compound and Sn are employed as a material of the connection terminal. In the high-temperature exposure test, the increase in contact resistance is significantly prevented when the protective coating agent is applied, so that the effect of the protect coating is apparent. As the protective coating agent, fluorine-based oil can effectively prevent the resistance from increasing rather than silicone-based oil. This is considered to be due to the effect of moisture absorption and gas permeability, and to contact resistance can be prevented from increasing when the agent has a higher ability of preventing the oxidation of metal. Further, it is found that for silicone grease with high viscosity, which is also evaluated as a protective coating agent, contact resistance is increased as compared with the case where a protective coating agent is not used, when its solidification is progressed. It is also found that maintaining a liquid state is necessary to prevent resistance of the contact portion from increasing. FIG. 19 shows variations in contact resistance when a temperature cycle test was carried out with respect to the same sample as in FIG. 18. When a protective coating agent is applied, the resistance of a Sn-based solder terminal containing an Ag—Sn intermetallic compound is remarkably prevented from increasing. In a Sn terminal, silicone-based oil prevents resistance from increasing, while fluorine-based oil has very small effect of preventing resistance from increasing. Fluorine-based oil has an effect of preventing oxidation. However, the viscosity of the oil employed here was not so high, and thus, it is considered that a role as the lubricating agent was so weak that the effect of preventing the increase in resistance due to micro-sliding wear of a soft Sn terminal was small. Desirable properties to function effectively as a protective coating agent are as follows: less volatility and hardness in proceeding polymerization reaction even at high temperatures to maintain the liquid state over a long period of time; low hygroscopicity and gas permeability and having an effect of preventing oxidation of protectively coated metal; and relatively high viscosity and capability of functioning as a lubricant in metal friction. From this point of view, chemically stable polymeric silicone oil or fluorine-based oil may be desirable as a protective coating agent.

In the present embodiment, for both of the connection terminal of the in-vehicle electronic module and the outermost surface materials of the mating connector terminal, Sn-based solder containing an Ag—Sn intermetallic compound was employed.

Since an Ag—Sn intermetallic compound is hard and Sn-based solder is soft, the soft Sn-based solder is extruded therearound by plastic flow when the connector terminal is pressed against the connection terminal at a predetermined pressure. Further, the hard Ag—Sn intermetallic compound is easily remained on the contact surface. Thus, a ratio of the contact area via the Ag—Sn intermetallic compound is increased. Since an Ag—Sn intermetallic compound is hardly oxidized and contact resistance of its region is kept low, and even when Sn-based solder is reacted with the underlying layer to grow a reaction layer, the Ag—Sn intermetallic compound remains on a surface layer regardless of the growth of the reaction layer, low contact resistance is maintained continuously over a long period of time, and a connector connection with high long-term reliability can be provided.

Further, in the present embodiment, a method of forming a connection terminal of the in-vehicle electronic module includes: immersing, in a melting bath filled with Sn-based solder containing Ag of 2 to 10 wt %, and supplying Sn-based solder containing an Ag—Sn intermetallic compound which is formed on the connection terminal surface of the in-vehicle electronic module; and removing excess molten solder physically to be adjusted to a predetermined thickness. The Sn-based solder layer containing an Ag—Sn intermetallic compound is formed by a dipping method that includes immersing, in the molten bath filled with the Sn-based solder containing Ag of 2 to 10 wt %, and supplying solder, and removing excess adhering molten solder by using a leveler or gas blowing. This makes it possible to form a connection terminal with a thick Sn-based solder layer at a significantly low cost in comparison with a wet-plating method, and easily adjust content of Ag—Sn intermetallic compound.

REFERENCE SIGNS LIST 1 organic insulating substrate
2 Cu wiring
3 circuit board
4 Sn-based solder containing an Ag—Sn intermetallic compound
5 connection terminal
6 to 9 electronic components
10 resin case
11 die-casting
12 connector accommodation part
13 resin wall
14 rear lid
15 board insertion groove
18 heat conduction grease
21 opening

The invention claimed is:
1. An in-vehicle electronic module, comprising:
a circuit board on which an electronic component is mounted;
a box type case or a protective member made of mold resin that accommodates and protects the circuit board from surrounding environment; and
a connector accommodating member that is integrally formed with the protective member and has an opening space for accommodating a mating connector,
wherein the in-vehicle electronic module has a connection structure in which an end portion of the circuit board on which the electronic component is not mounted is protruded from the protective member to the opening space of the connector accommodating member and the end portion of the board is inserted into the mating connector to obtain electrical continuity, and a connection terminal of the board has a structure of Cu wiring/Cu—Sn reaction layer/Sn-based alloy layer containing an Ag—Sn intermetallic compound.

2. The in-vehicle electronic module according to claim 1, wherein an Sn-based solder layer containing an Ag—Sn intermetallic compound is formed to have a thickness of two times or more a thickness of an underlying Cu wiring of the connection terminal and a reaction layer of Sn.

3. The in-vehicle electronic module according to claim 2, wherein the connection terminal includes a Cu wiring member formed on an organic insulating substrate, and the reaction layer is a Cu—Sn intermetallic compound.

4. The in-vehicle electronic module according to claim 2, wherein chemically stable oil that maintains a liquid state under use environment over a long period of time and prevents Sn-based alloy and Cu from being corroded is applied on a surface of the connection terminal.

5. A connector connection structure of an in-vehicle electronic module, which is a contact connection structure that connects the connection terminal of the in-vehicle electronic module according to claim 1 and a connector terminal of a mating connector connected to an external wiring, wherein an outermost surface of the connector terminal includes a Sn or Sn-based solder layer to cover a contact connecting portion between the connection terminal and the connector terminal, and chemically stable oil that maintains a liquid state under use environment over a long period of time and prevents Sn-based alloy and Cu from being corroded is applied.

6. A connector connection structure of an in-vehicle electronic module, which is a contact connection structure that connects the connection terminal of the in-vehicle electronic module according to claim 1 and a connector terminal of a mating connector connected to an external wiring, wherein a surface of the connector terminal includes an Sn-based solder layer containing an Ag—Sn intermetallic compound, and the Ag—Sn intermetallic compound is formed at a contact interface between the connection terminal and the connector terminal and makes contact connection.

7. The connector connection structure of the in-vehicle electronic module according to claim 6, wherein a contact connecting portion between the connection terminal of the in-vehicle electronic module and the connector terminal of the mating connector is covered with chemically stable oil that maintains a liquid state under use environment over a long period of time and prevents Sn-based alloy and Cu from being corroded.

8. A method of forming the connection terminal of the in-vehicle electronic module according to claim 1, comprising:

immersing, in a melting bath filled with Sn-based solder containing Ag of 2 to 10 wt %, and supplying Sn-based solder containing an Ag—Sn intermetallic compound formed on a surface of the connection terminal; and removing excessive molten solder physically to be adjusted to a predetermined thickness.

9. An in-vehicle electronic module, wherein an outermost surface of a connection terminal inserted into a mating connector to obtain electrical continuity includes a Sn-based solder layer containing an Ag—Sn intermetallic compound.

10. The in-vehicle electronic module according to claim 9, wherein the Sn-based solder layer containing an Ag—Sn intermetallic compound is formed to have a thickness of two times or more a thickness of a reaction layer of a underlying conductive material member and an Sn of the connection terminal.

11. The in-vehicle electronic module according to claim 9, wherein the Sn-based solder has an average thickness of 4 μm or more.

* * * * *